United States Patent
Boser et al.

(10) Patent No.: US 10,522,737 B2
(45) Date of Patent: Dec. 31, 2019

(54) VARIABLE THICKNESS DIAPHRAGM FOR A WIDEBAND ROBUST PIEZOELECTRIC MICROMACHINED ULTRASONIC TRANSDUCER (PMUT)

(71) Applicant: THE REGENTS OF THE UNIVERSITY OF CALIFORNIA, Oakland, CA (US)

(72) Inventors: Bernhard Boser, Berkeley, CA (US); David Horsley, Albany, CA (US); Richard Przybyla, Berkeley, CA (US); Ofer Rozen, Davis, CA (US); Stefon Shelton, Oakland, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 784 days.

(21) Appl. No.: 15/135,321

(22) Filed: Apr. 21, 2016

(65) Prior Publication Data
US 2016/0315247 A1    Oct. 27, 2016

Related U.S. Application Data

(63) Continuation of application No. PCT/US2015/018076, filed on Feb. 27, 2015.
(Continued)

(51) Int. Cl.
*B06B 1/06* (2006.01)
*H01L 41/09* (2006.01)
(Continued)

(52) U.S. Cl.
CPC .......... *H01L 41/335* (2013.01); *B06B 1/0622* (2013.01); *B06B 1/0666* (2013.01);
(Continued)

(58) Field of Classification Search
CPC ... B06B 1/0622; B06B 1/0666; H01L 41/083; H01L 41/0973; H01L 41/1138; H01L 41/187; G10K 9/121
See application file for complete search history.

(56) References Cited

U.S. PATENT DOCUMENTS

| | | | |
|---|---|---|---|
| 5,870,351 A | 2/1999 | Ladabaum et al. | |
| 6,584,660 B1 * | 7/2003 | Shimogawa | B41J 2/14233 219/121.69 |

(Continued)

FOREIGN PATENT DOCUMENTS

| | | | |
|---|---|---|---|
| JP | 2002-044785 A | 2/2002 | |
| JP | 2014209728 A | * 11/2014 | .......... A61B 8/4483 |

OTHER PUBLICATIONS

European Patent Office (EPO), Office Action (communication pursuant to Article 94(3) EPC) dated Mar. 8, 2018, related European patent application No. 15 754 603.7, pp. 1-6, claims examined, pp. 7-10.

(Continued)

*Primary Examiner* — J. San Martin
(74) *Attorney, Agent, or Firm* — O'Banion & Ritchey LLP; John P. O'Banion

(57) ABSTRACT

A diaphragm for a piezoelectric micromachined ultrasonic transducer (PMUT) is presented having resonance frequency and bandwidth characteristics which are decoupled from one another into independent variables. Portions of at least the piezoelectric material layer and backside electrode layer are removed in a selected pattern to form structures, such as ribs, in the diaphragm which retains stiffness while reducing overall mass. The patterned structure can be formed by additive, or subtractive, fabrication processes.

24 Claims, 14 Drawing Sheets

Related U.S. Application Data

(60) Provisional application No. 61/945,906, filed on Feb. 28, 2014.

(51) Int. Cl.

| | | |
|---|---|---|
| *H01L 41/335* | (2013.01) | |
| *G10K 9/12* | (2006.01) | |
| *H01L 41/083* | (2006.01) | |
| *H01L 41/113* | (2006.01) | |
| *H01L 41/187* | (2006.01) | |
| *H01L 41/332* | (2013.01) | |
| *G10K 9/122* | (2006.01) | |
| *G10K 13/00* | (2006.01) | |

(52) U.S. Cl.
CPC ............. *G10K 9/121* (2013.01); *G10K 9/122* (2013.01); *G10K 13/00* (2013.01); *H01L 41/083* (2013.01); *H01L 41/0973* (2013.01); *H01L 41/1138* (2013.01); *H01L 41/187* (2013.01); *H01L 41/332* (2013.01)

(56) References Cited

U.S. PATENT DOCUMENTS

| | | | | |
|---|---|---|---|---|
| 7,522,018 | B2 | 4/2009 | Milsom et al. | |
| 7,615,834 | B2 | 11/2009 | Khuri-Yakub et al. | |
| 8,040,020 | B2* | 10/2011 | Martin | B81B 7/0058 |
| | | | | 310/324 |
| 8,357,981 | B2* | 1/2013 | Martin | G10K 9/125 |
| | | | | 257/415 |
| 8,483,014 | B2 | 7/2013 | Huang | |
| 2002/0014816 | A1* | 2/2002 | Takeuchi | B81B 3/0021 |
| | | | | 310/358 |
| 2002/0048219 | A1 | 4/2002 | Ladabaum et al. | |
| 2008/0012909 | A1* | 1/2008 | Matsuda | H01L 41/0973 |
| | | | | 347/68 |
| 2008/0013405 | A1 | 1/2008 | Moon et al. | |
| 2011/0122731 | A1 | 5/2011 | Buccafusca et al. | |
| 2011/0128327 | A1* | 6/2011 | Kubota | C04B 35/4682 |
| | | | | 347/68 |
| 2011/0198970 | A1 | 8/2011 | Martin et al. | |
| 2011/0291207 | A1 | 12/2011 | Martin | |
| 2012/0306316 | A1* | 12/2012 | Nakamura | H01L 41/0973 |
| | | | | 310/322 |
| 2014/0028760 | A1* | 1/2014 | Sameshima | B41J 2/14233 |
| | | | | 347/71 |
| 2015/0162523 | A1* | 6/2015 | Umeda | H01L 41/0478 |
| | | | | 310/331 |
| 2017/0368574 | A1* | 12/2017 | Sammoura | B06B 1/0603 |

OTHER PUBLICATIONS

Korean Intellectual Property Office (KIPO), International Search Report and Written Opinion, PCT/US2015/018076, dated Jun. 10, 2015, pp. 1-11, with claims searched, pp. 12-17. The relevance of the non-English language reference listed above is set forth in this search report and written opinion. Therefore, a separate concise statement of the relevance is not required.

Huang, Y., et al., Capacitive micromachined ultrasonic transducers with piston-shaped membranes: Fabrication and experimental characterization. Ultrasonics, Ferroelectrics and Frequency Control, IEEE Transactions on, 2009. 56(1): p. 136-145.

Shelton, S., et al., "Aluminum Nitride Piezoelectric Micromachined Ultrasound Transducer Arrays", 2012 Solid-State Sensors, Actuators and Microsystems Workshop, Hilton Head, SC, Jun. 2012, pp. 291-294.

Przybla, R., et al., "In-Air Ultrasonic Rangefinding and Angle Estimation Using an Array of AlN micromachined Transducers", 2012 Solid-State Sensors, Actuators and Microsystems Workshop, Hilton Head, SC, Jun. 2012, pp. 50-53.

* cited by examiner

200μm

40μm

VARIABLE THICKNESS DIAPHRAGM FOR A WIDEBAND ROBUST PIEZOELECTRIC MICROMACHINED ULTRASONIC TRANSDUCER (PMUT)

CROSS-REFERENCE TO RELATED APPLICATIONS

This application is a 35 U.S.C. § 111(a) continuation of PCT international application number PCT/US2015/018076 filed on Feb. 27, 2015, incorporated herein by reference in its entirety, which claims priority to, and the benefit of, U.S. provisional patent application Ser. No. 61/945,906 filed on Feb. 28, 2014, incorporated herein by reference in its entirety. Priority is claimed to each of the foregoing applications.

The above-referenced PCT international application was published as PCT International Publication No. WO 2015/131083 on Sep. 3, 2015, which publication is incorporated herein by reference in its entirety.

STATEMENT REGARDING FEDERALLY SPONSORED RESEARCH OR DEVELOPMENT

Not Applicable

INCORPORATION-BY-REFERENCE OF COMPUTER PROGRAM APPENDIX

Not Applicable

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. § 1.14.

BACKGROUND

1. Technological Field

This technical disclosure pertains generally to ultrasonic transducers, and more particularly to an ultrasonic transducer which can be readily configured for a desired dynamic response.

2. Background Discussion

Piezoelectric micromachined ultrasonic transducers (PMUTs) are micro-electro-mechanical system (MEMS) devices which operate in response to flexural motion of a thin membrane coupled with a thin piezoelectric film, instead of thickness-mode motion of a plate of piezoelectric ceramic as within bulk piezoelectric ultrasound transducers. It will be noted that PMUTs are a class of micromachined ultrasonic transducers (MUTs). In comparison with bulk piezoelectric ultrasound transducers, PMUTs can offer advantages such as increased bandwidth, flexible geometries, natural acoustic impedance match with water or air, reduced voltage requirements, mixing of different resonant frequencies and potential for integration with supporting electronic circuits especially for miniaturized high frequency applications.

However, despite the intensive study of MUTs in recent decades, most PMUT designs adhere to clamped square and circular plates, or if they have different mechanical configurations it is toward obtaining different goals/objectives than in this disclosure. For instance, certain PMUT configurations are targeted to achieve piston-like movement, in order to increase the output pressure and the active area of the device. Yet, piezoelectric actuated transducers require a curvature mode shape in order to couple the electrical and the mechanical energy efficiently. For example, a prior study performed by the inventors on a circular flexurally-suspended PMUT had a piston-like mode shape. It was found that although the linear operating range was increased, the output pressure and bandwidth were compromised.

Therefore, a need exists for enhanced PMUT designs which provide increased resonant frequency control, bandwidth and other enhanced operating characteristics.

BRIEF SUMMARY

Piezoelectric micromachined ultrasonic transducers (PMUTs) are described having a transducer surface which is patterned, so that both mass and stiffness of the diaphragm can be modified independently of one another. The technology presented is applicable to PMUTs, as well as MUTs in general, and to other vibrating plate structures. This method allows targeting the mechanical dynamic response of the transducer to the required resonance frequency and bandwidth. This technique is implemented for designing wideband piezoelectric micromachined ultrasonic transducers that have low sensitivity to residual stress in order to enable the fabrication on a single chip or wafer of multiple PMUTs having the same center frequency, but can also be used to meet other dynamic requirements.

Further aspects of the presented technology will be brought out in the following portions of the specification, wherein the detailed description is for the purpose of fully disclosing preferred embodiments of the technology without placing limitations thereon.

BRIEF DESCRIPTION OF THE SEVERAL VIEWS OF THE DRAWING(S)

The disclosed technology will be more fully understood by reference to the following drawings which are for illustrative purposes only:

DETAILED DESCRIPTION

Dynamic response in a piezoelectric micromachined ultrasonic transducer (PMUT), namely its center frequency and bandwidth, is principally determined by its mechanical resonance. Therefore, dynamic response is a function of planar geometry, boundary conditions, material properties and thickness. In a simple diaphragm with uniform thickness, the resonance frequency and its bandwidth are dependent variables.

In order to separate (decouple) these two dependent variables and therefore enable design of transducers with a variety of dynamic responses, the present disclosure patterns the diaphragm by selectively removing or adding layers in pre-defined regions, which makes resonant frequency and bandwidth substantially independent variables. This approach also allows the stiffness of the diaphragm to be increased, thereby reducing the effect of stress on the center frequency of the diaphragm.

If the diaphragm mechanics are modeled as a lumped second order mass-spring-damper (m, k, b) system, the center frequency $\omega$ and the bandwidth $\Delta\omega$ can be written as:

$$\omega = \sqrt{k/m} \quad (1)$$

$$\Delta\omega = b/m \quad (2)$$

where the degree of freedom (DOF) is the center displacement of the diaphragm. A common metric to describe bandwidth is the quality factor $Q=\omega/\Delta\omega$.

Figure 1A:
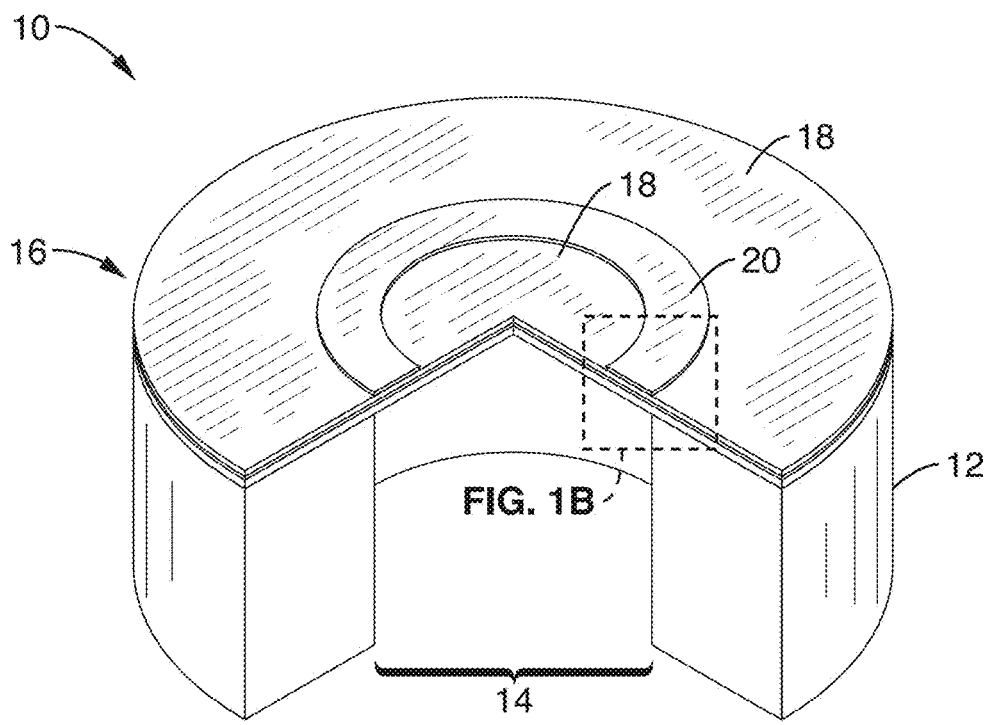
FIG. 1A and FIG. 1B are a pictorial cross-section and material layer cross-section, respectively, of a conventional PMUT having a piezoelectric layer shown with a top electrode.
Figure 1B:
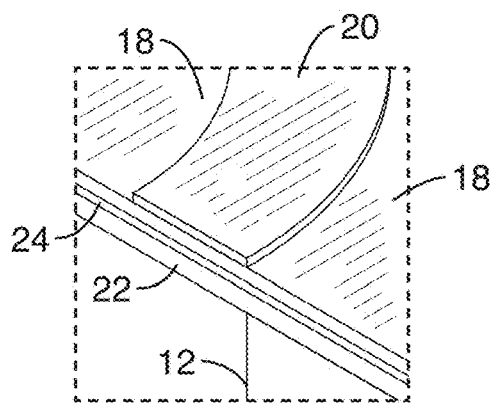

FIG. 1A through FIG. 1B illustrate an embodiment 10 of a reference design, denoted herein as 'design 0' having a support structure (handle) 12, backside tube 14, flat constant-thickness diaphragm 16 configured with a top piezo surface 18. In the figure, one sees this piezo surface continuing on both sides beneath a top electrode 20. The diaphragm 16 is shown in FIG. 1B to comprise a passive elastic layer 22, over which is a metal layer 24, upon which piezo layer 18 is disposed. The diaphragm thickness is uniform except for the material of deposited top electrode 20.

The diaphragm has mass $m_0$, stiffness $k_0$ and damping $b_0$ which are a function of the diaphragm area $A_0$ and thickness $t_0$:

$$m_0 \propto A_0 t_0 \quad (3)$$

$$b_0 \propto A_0$$

$$k_0 \propto \frac{t_0^3}{A_0}$$

Therefore, the center frequency $\omega_0$ and bandwidth $\Delta\omega_0$ are:

$$\omega_0 \propto \frac{t_0}{A_0} \quad (4)$$

$$\Delta\omega_0 \propto \frac{1}{t_0}.$$

Stress is known to result in variations in the effective stiffness of the diaphragm, which in turn results in changes in the center frequency $\omega_0$ in much the same way that tension in a guitar string increases its frequency. A laminated diaphragm with a stressed AlN layer, will have a center frequency $\omega_{0,res}$ that is shifted relative to that of an unstressed diaphragm $\omega_0$:

$$\left(\frac{\omega_{0,res}}{\omega_0}\right)^2 = \left[1 + \frac{a^2 \sigma t}{\lambda_{01}^2 D}\right] \quad (5)$$

where a denotes the radius, $\sigma$ the average stress, t the thickness, $D \propto t^3$ the flexural rigidity and $\lambda_{01}$ is a constant defined by the vibration mode-shape of the diaphragm. This equation shows that, for a given level of stress variation, it is possible to reduce the effect of stress on center frequency by increasing the thickness and therefore stiffness $k_0$, seen in Eq. 3. However, from Eq. 4, it will be noted that the center frequency can be kept constant when the thickness is increased by increasing the area by the same proportion. Yet this approach has the undesirable effect of reducing the bandwidth $\Delta\omega_0$.

By removing mass from the diaphragm by selectively reducing its thickness in various locations, the novel device structure described here allows the PMUT design to be targeted not only towards the required frequency but also towards a specific bandwidth and stiffness. However, since mass reduction of the diaphragm also affects its stiffness, it is important to tailor the stiffness, area, and mass of the diaphragm to fit the required frequency, bandwidth, and stress sensitivity. This novel configuration is referred to herein as 'design 1', so its parameters mass $m_1$, stiffness $k_1$ and damping $b_1$ are functions of the new total diaphragm area $A_1$ and maximum thickness $t_1$:

$$m_1 \propto (1-X)A_1 t_1 \quad (6)$$
$$b_1 \propto A_1$$
$$k_1 \propto \frac{t_1^3}{A_1}(1-Y)$$

where X represents the mass reduction relative to the mass of a constant thickness diaphragm with the same planar geometry, and Y represents the stiffness reduction relative to that of a diaphragm with the same planar geometry.

Assuming that 'design 1' targets the same center frequency as 'design 0', $\omega_1 = \omega_0$, the bandwidth can be adjusted by the mass reduction and thickness as given by:

$$\Delta \omega_1 = \frac{1}{t_1(1-X)} \quad (7)$$

while the size of the new design is determined by both the change in stiffness and mass:

$$\frac{A_0}{t_0} = \frac{A_1\sqrt{(1-X)}}{t_1\sqrt{(1-Y)}} \quad (8)$$

As demonstrated by Eqs. 6-8, introducing X and Y adds two new design variables that broaden the design space.

Figure 2A:
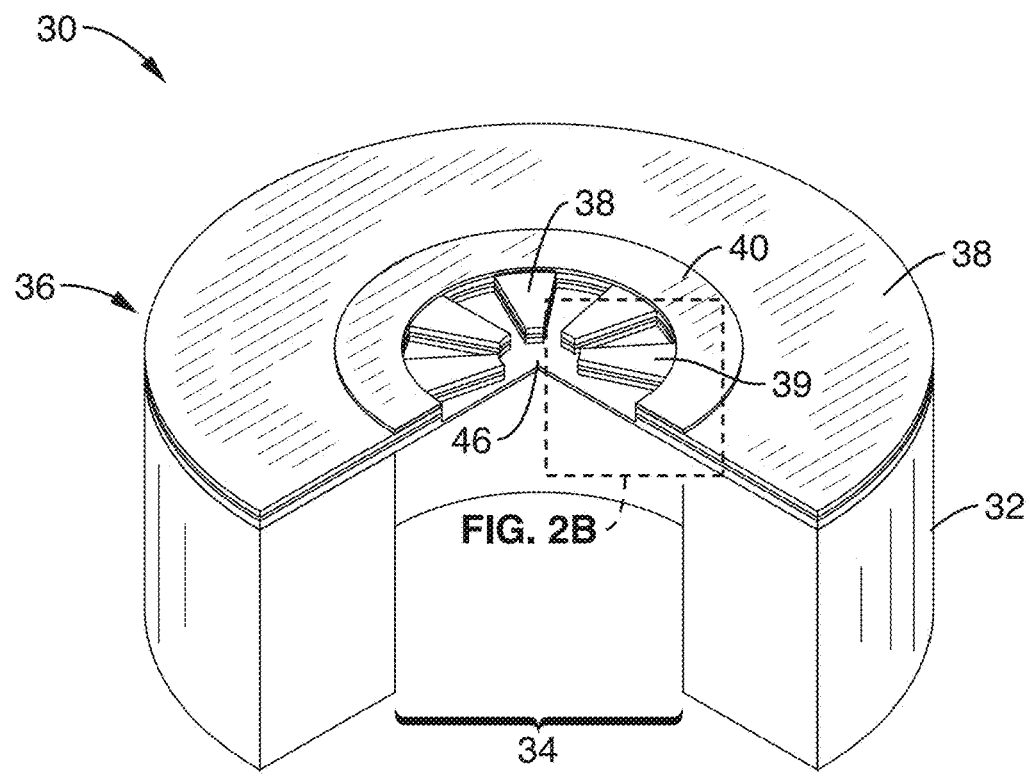
FIG. 2A and FIG. 2B are a pictorial cross-section and material layer cross-section, respectively, of a patterned PMUT according to an embodiment of the present disclosure.
Figure 2B:
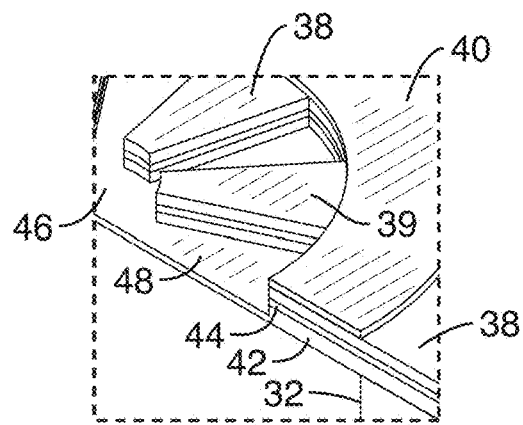

FIG. 2A and FIG. 2B illustrate an example embodiment 30 of the disclosed transducer ('design 1') having a thick diaphragm that is patterned on its surface with wedge-shaped ribs that reduce the mass while enhancing stiffness. The presented embodiment 30 has a support structure (handle) 32, backside tube 34, a patterned thickness diaphragm 36 that is actuated using piezo layer 38 by applying voltage to top electrode 40. It should be appreciated that tube 34 is not required in the structure, only that some mechanism provide for holding the edges of the diaphragm fixed (e.g., wafer or support structure).

A series of "ribs" 39 are seen extending from a perimeter of the cut areas 48 toward a central cut area 46. In this example, each rib 39 is in a wedge shape (isosceles triangle) with its tip cut off, this shape being generally referred to as isosceles trapezoid. It should be appreciated, however, that other rib shapes may be utilized without departing from the present teachings. The preferred taper angles on the sides of the ribs may be anything from 0° (straight bar ribs) through to 45°.

The diaphragm 36 is shown in FIG. 2B to comprise a passive (elastic) layer 42, over which is a conductive (metal) layer 44, upon which the active piezo layer 38 is deposited. The top electrode 40 is a closed shape surrounding an open area, for example a closed-shape ring, along the non-patterned edges of the diaphragm, but can also be patterned on the ribs to enhance the coupling of piezoelectric stress to diaphragm displacement, and other patterns are possible for top electrode 40. The patterning can be seen in the figure in which center region 46 along with interdigital areas 48, are substantially cut away, such as to remove the piezo and conductive layers, and in this specific example even a major thickness portion of the passive layer is etched away. The thickness of center region 46 is preferably in the range from 0.5 microns to 4 microns, or more preferably between from 1 micron to 2 microns. It should be appreciated that the patterning of the PMUT may be fabricated using a subtractive material removal process (e.g., cutting, etching, ablation), or the pattern formed from an additive process, or a combination of subtractive and additive processes utilized to create the patterned PMUT. The circular PMUT shape seen in FIG. 2A and FIG. 2B is shown by way of example, while the present disclosure may be implemented in a range of geometries without departing from the disclosure.

In the present disclosure the piezoelectric material is exemplified as Aluminum Nitride (AlN), however, it will be appreciated that numerous materials exhibiting piezoelectric behavior may be alternatively utilized without departing from the present teachings. By way of example and not limitation, material may be selected for use from the group of materials exhibiting piezoelectric behavior comprising Apatite, Barium Titanate ($BaTiO_3$), Berlinite ($AlPO_4$), various Ceramic materials, Allium Phosphate, Gallium Nitride (GaN), Gallium Orthophosphate, Lanthanum Gallium Silicate, Lead Scandium Tantalate, Lead Magnesium Niobate (PMN), Lead Zirconate Titanate (PZT), Lithium Tantalate, Polyvinylidene Fluoride (PVDF), Potassium Sodium Tartrate, Quartz ($SiO_2$), Zinc Oxide (ZnO), and other materials and combinations as will be known to one of ordinary skill in the art. By way of example and not limitation, one class of ceramics materials exhibiting piezo electric properties are ceramic structures exhibiting perovskite tungsten-bronze structures, including $BaTiO_3$, $KNbO_3$, $Ba_2NaNb_5O_5$, $LiNbO_3$, $SrTiO_3$, $Pb(ZrTi)O_3$, $Pb_2KNb_5O_{15}$, $LiTaO_3$, $BiFeO_3$, $Na_xWO_3$. Similarly, various materials may be used for the elastic layer of the PMUT diaphragm, including for example silicon, silicon nitride, and silicon dioxide. It will also be appreciated that an active piezoelectric material may be used for the elastic layer of the diaphragm. Numerous materials exhibiting piezoelectric behavior may be alternatively utilized for the elastic layer without departing from the present teachings, including Aluminum Nitride (AlN), Apatite, Barium Titanate ($BaTiO_3$), Berlinite ($AlPO_4$), various Ceramic materials, Allium Phosphate, Gallium Orthophosphate, Gallium Nitride (GaN), Lanthanum Gallium Silicate, Lead Scandium Tantalate, Lead Magnesium Niobate (PMN), Lead Zirconate Titanate (PZT), Lithium Tantalate, Polyvinylidene Fluoride (PVDF), Potassium Sodium Tartrate, Quartz ($SiO_2$), Zinc Oxide (ZnO), and combinations thereof.

Figure 3:
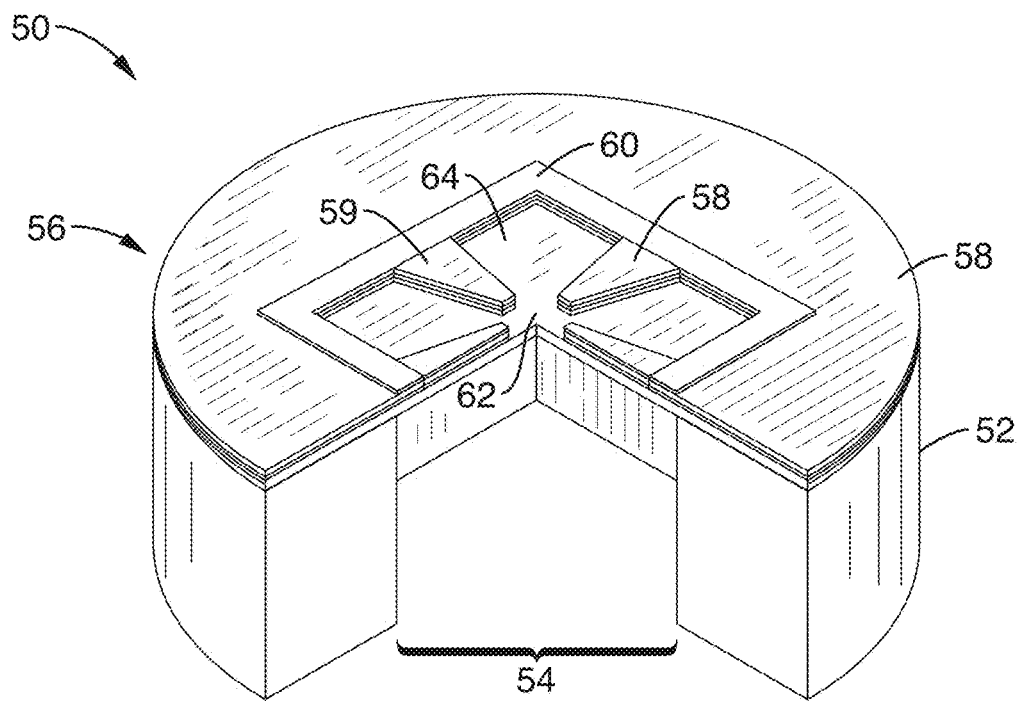
FIG. 3 is a pictorial cross-section of a square patterned PMUT according to an embodiment of the present disclosure.
Figure 4:
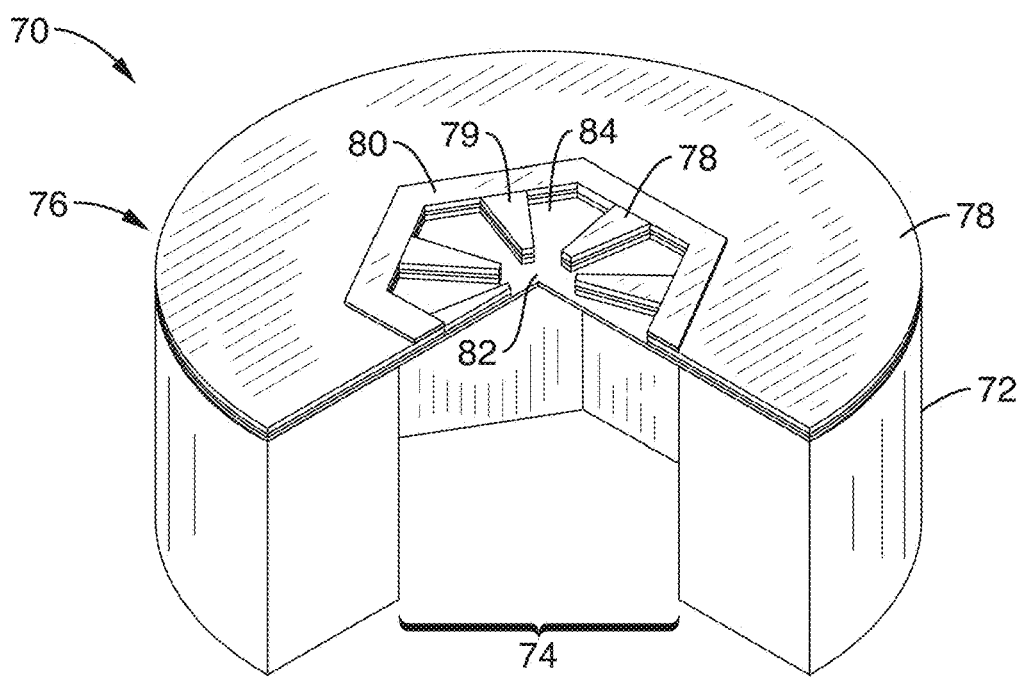
FIG. 4 is a pictorial cross-section of a hexagonal patterned PMUT according to an embodiment of the present disclosure.
Figure 5:
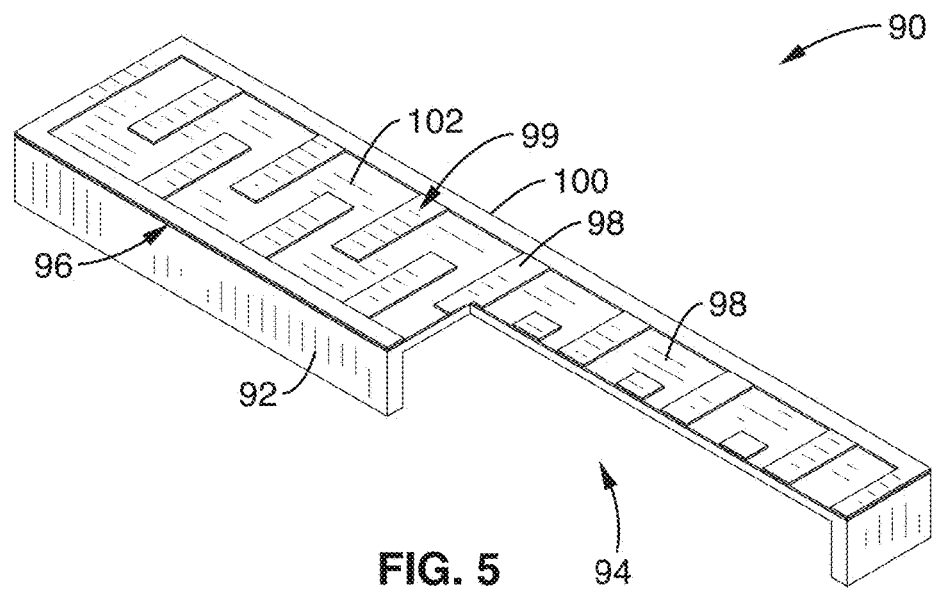
FIG. 5 is a pictorial cross-section of an elongate linear patterned PMUT according to an embodiment of the present disclosure.

FIG. 3 through FIG. 5 illustrate additional example embodiments having square, hexagonal and rectangular diaphragms.

In FIG. 3 a patterned square PMUT embodiment 50 is shown with handle 52, backside tube 54, patterned diaphragm 56 configured with a piezo layer 58 beneath a square shaped top electrode 60. It can be seen that material is removed from the center 62, and in radial sections 64, leaving protruding rib sections 59, which are the only portions containing piezo layer 58 within the interior of the top electrode. In this example, one rib (e.g., isosceles trapezoid) is shown extending from each of the sides of the square 60 perimeter.

In FIG. 4 a patterned hexagonal PMUT embodiment 70 is shown with handle 72, backside tube 74, patterned diaphragm 76 configured with a piezo layer 78 beneath a hexagon-shaped top electrode 80. It can be seen that material is removed from the center 82, and in radial sections 84, leaving protruding rib sections 79, which are the only portions containing piezo layer 78 within the interior of the top electrode. In this example one rib (e.g., isosceles trapezoid) is shown extending from each of the sides of the hexagon 80 perimeter, although this is not a limitation of any of the embodiments. It should be appreciated that the above PMUTs are examples of devices which are radially symmetric. The present disclosure however, applies not only to any radially symmetric form, but to other forms/shapes as well.

In FIG. 5 is shown an example of other forms which are not radially symmetric. A patterned elongate linear PMUT embodiment 90 is shown with handle 92, backside opening 94, patterned diaphragm 96 configured with piezo layer 98. Structure 90 illustrates a top electrode 100 around its perimeter. It can be seen that material is removed from interior regions 102, leaving protruding rib sections 99, which are depicted here by way of example as being rectangular shaped.

However, it should be appreciated that center frequency and bandwidth are not the only characteristics of an ultrasonic transducer. The range of a transducer is a function of the output pressure and its receiver sensitivity, which should therefore be considered during the design process.

Implementations of the invention include piezoelectric micromachined ultrasonic transducers (PMUTs), or other vibrating diaphragm structures, for different applications, such as range and angle detection, flow measurements and medical imaging. Transducers of this type require a short time constant that is equivalent to a wide bandwidth frequency response. In addition, the medium in which the transducer is operating (e.g., air or other gases, fluids, solids), along with the maximum range over which the sound will propagate dictate operating at specific frequencies. For example, air coupled transducers require center frequency between 40-800 kHz, while their bandwidth should be at least 10% of the center frequency. Transducers can be designed with fractional bandwidth $\Delta\omega/\omega$ between 1% and 40% or specifically between 5% and 25% or more specifically between 5% and 15%. Transducers can be designed with center frequency from 20 kHz to 800 kHz or specifically from 40 kHz to 450 kHz or more specifically from 80 kHz to 300 kHz.

Figure 6:
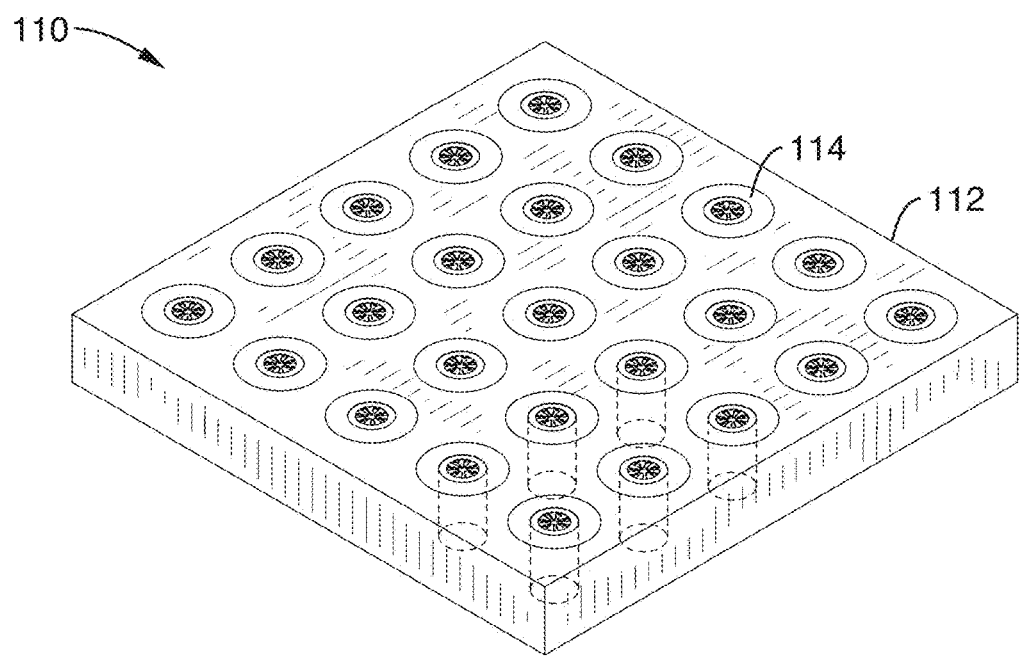
FIG. 6 is a pictorial cross-section of an array of patterned PMUTs according to an embodiment of the present disclosure.

FIG. 6 illustrates a PMUT array 110, with any desired number of PMUTs 114 on the same substrate 112. By way of example and not limitation, the array is shown with 25 PMUTs in a rectangular 5×5 pattern. It should be appreciated that PMUTs of any desired geometry may be utilized, while the array itself may comprise any desired PMUT arrangement (array pattern), with any desired spacing. It should be appreciated that an array of transducers may be desirable for generating sufficient pressure and/or for sensing applications, such as when measuring location and velocity. In many applications, it is important for all the transducers in the array to vibrate at the same frequency, whereby that design must aim for a very low variation in the center frequency due to residual stress or other fabrication tolerance. By increasing the total thickness and removing mass from the center of the diaphragm, while adjusting the diaphragm dimensions, a PMUT can be designed according to the present disclosure which has a wide bandwidth and low sensitivity to residual stress.

It should be appreciated that the ribs may also be laser trimmed, in at least one embodiment of the disclosure, to modify the mass and/or stiffness of the PMUT, thereby trimming the frequency. By way of example and not limitation, this fine tuning of rib dimensions may be performed to enhance frequency matching between PMUT devices in an array.

Figure 7:
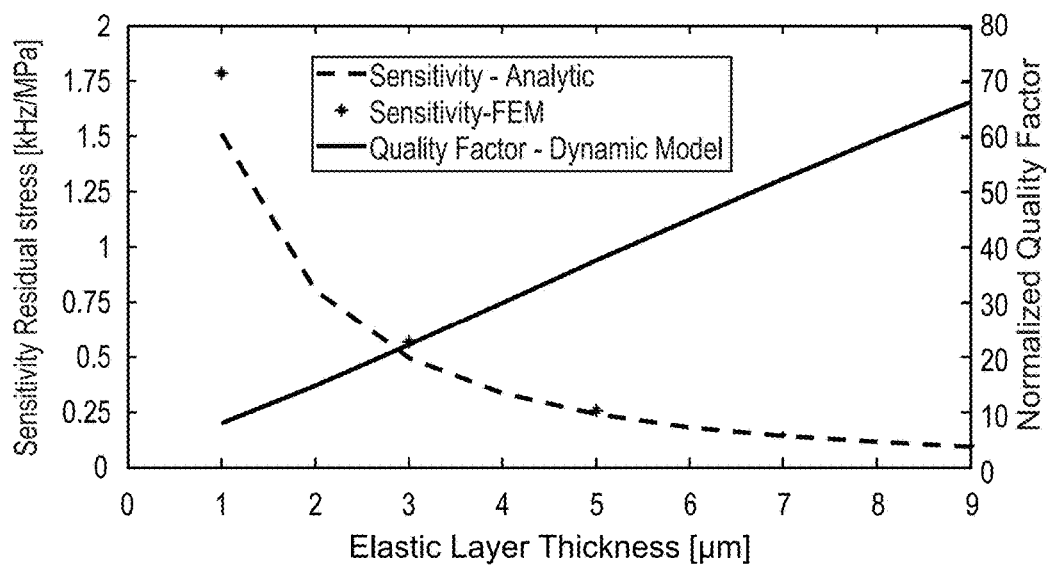
FIG. 7 is a plot of the resonance frequency's stress sensitivity versus thickness demonstrated according to an embodiment of the present disclosure.

FIG. 7 depicts sensitivity and quality factor for an example flat diaphragm PMUT design similar to the one shown in FIG. 1. Increasing the thickness, (moving to the right in the horizontal axis of the figure) reduces the sensitivity of the center frequency to stress but increases quality factor and therefore reduces the bandwidth. The stress sensitivity of the center frequency and the quality factor were modeled using finite element method (FEM) software.

Models of the new transducer design, as exemplified by FIG. 2A, were created for several different rib widths, using 3D, non-linear finite element method (FEM) eigenfrequency analyses.

Figure 8:
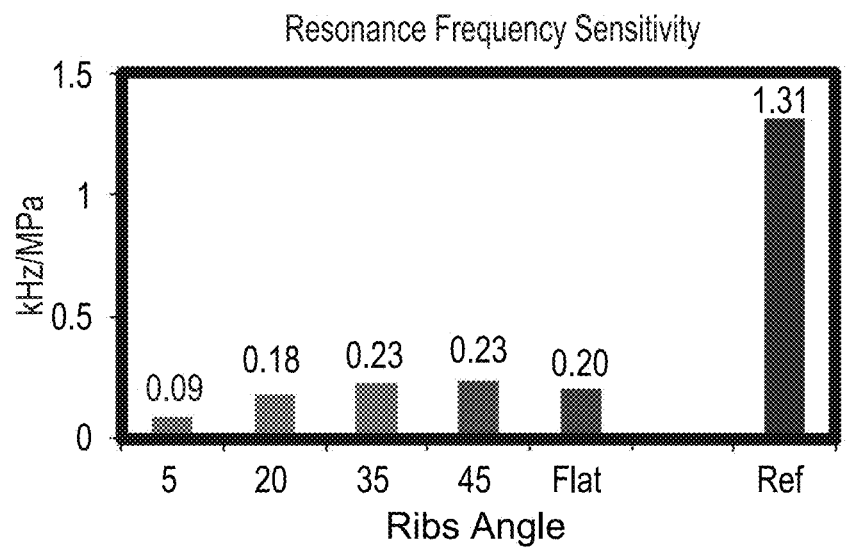
FIG. 8 is a bar plot of resonance frequency sensitivity depending for various rib angles demonstrated according to an embodiment of the present disclosure.

FIG. 8 is a bar graph depicting how the sensitivity of the center frequency to stress was simulated for devices with 8 ribs having 5, 20, 35, and 45 degree rib width. The flat design, marked 'Flat', has the same 750 micron diameter and 5 micron diaphragm thickness as the total thickness of the ribbed designs. The bar denoted Ref depicts a flat-plate reference design with 2 micron thickness and 400 micron diameter. Each design has a nominal center frequency of approximately 200 kHz. The resonance frequency sensitivity was found to be 0.09 kHz/MPa for the 5° rib width, 0.18 kHz/MPa for the 20° rib width, 0.23 kHz/MPa for the 35° rib width, 0.23 kHz/MPa for the 45° rib width, 0.20 kHz/MPa for flat transducer of same diameter and thickness, and 1.31 kHz/MPa for the reference design with 2 micron thickness and 400 micron diameter. The center frequency of each thick-layered configuration is from 5 to 14 times less sensitive to residual stress than that of the thin reference design.

The bandwidth of the different configurations was found by studying the frequency response of the transducer in air using a 3D piezo-acoustic FEM model that couples the piezoelectric structure with the acoustic medium (air). The model comprises three-dimensional geometry of the PMUT, the structural piezoelectric materials, the air medium, and a voltage input at the electrode. The patterned diaphragm design described here results in a reduced-mass/enhanced-stiffness structure which allows the bandwidth to be increased, or equivalently the quality factor $$Q = \frac{\omega}{\Delta\omega}$$

to be decreased.

Figure 9:
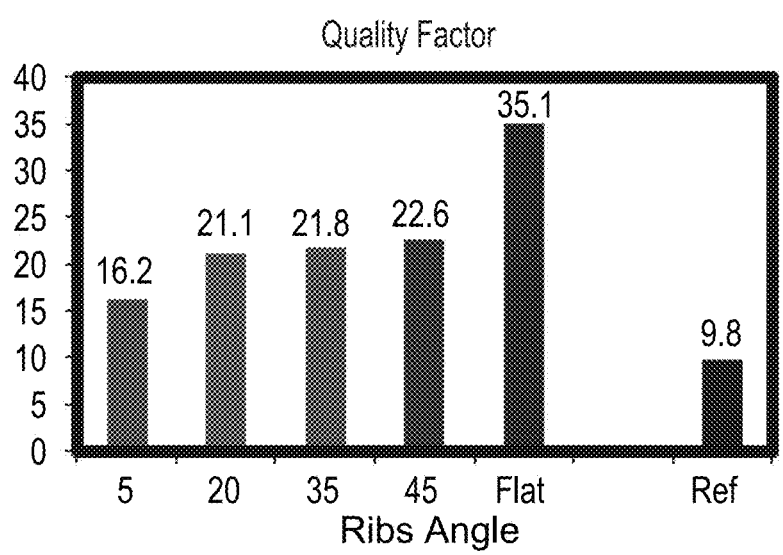
FIG. 9 is a bar plot of quality factor in response to the use of various rib angles demonstrated according to an embodiment of the present disclosure.

FIG. 9 depicts predicted quality factor for the novel design with various angular rib widths (5°, 20°, 35°, 45°) compared to a flat transducer of the same dimensions and a reference design with 2 micron thickness and 400 micron diameter. The quality factors were found to be 16.2 for the 5° rib width, 21.1 for the 20° rib width, 21.8 for the 35° rib width, 22.6 for the 45° rib width, 35.1 for flat transducer (same diameter and thickness), and 9.8 for the reference design with 2 micron thickness and 400 micron diameter. The quality factor found from the FEM matches the experimentally measured quality factor of the reference design, validating the FEM model's ability to predict a given design's quality factor.

Figure 10:
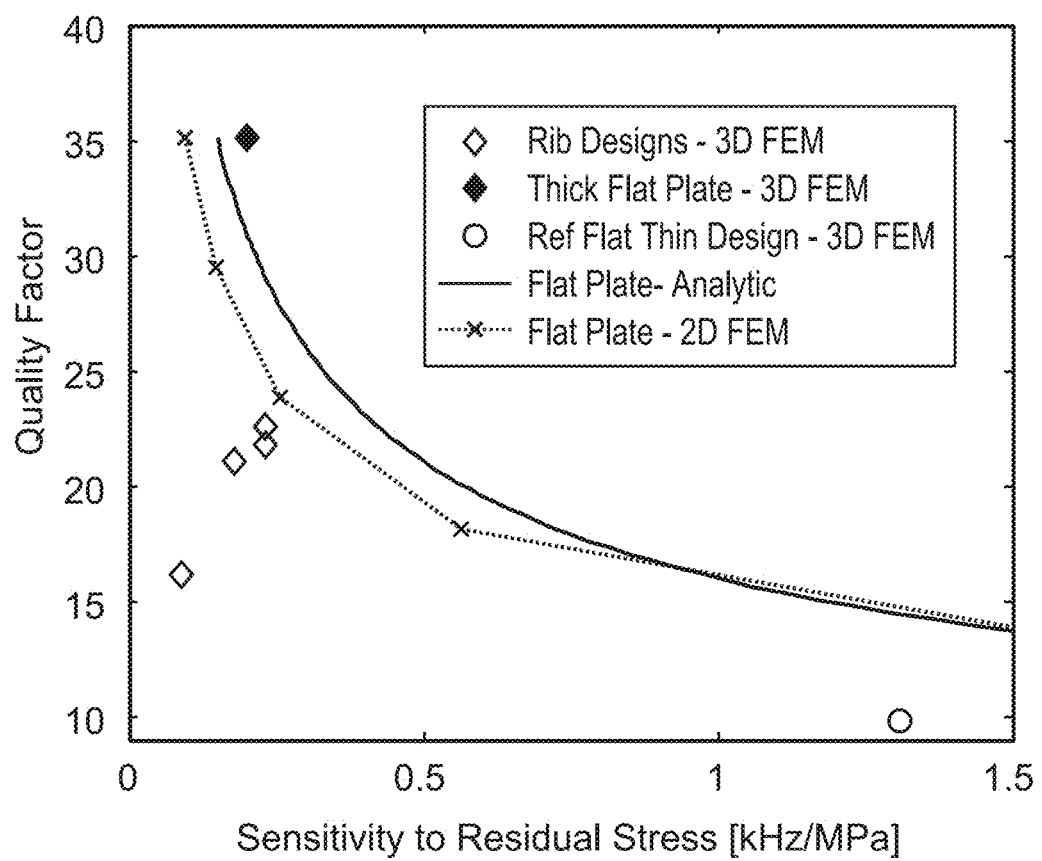
FIG. 10 is a plot of quality factor and sensitivity to residual stress for a number of PMUT designs, including rib designs, thick flat plates, reference flat thin design, and flat plate analytic and 2D FEM designs.

FIG. 10 depicts a plot of quality factor versus sensitivity of the center frequency to residual stress for the various designs. Ribbed designs are denoted by the open diamond shapes, with the thick flat diaphragm 3D FEM seen by the filled diamond, a reference thin flat diaphragm design is depicted by the circle in the lower right, with flat diaphragm analytic analysis seen by the solid line, and the flat diaphragm 2D FEM seen by the dotted line plot. It can be seen that in some cases, the ribbed designs have 1.5× to 3× lower quality factor and therefore 1.5× to 3× greater bandwidth than flat designs having equivalent stress sensitivity.

Figure 11:
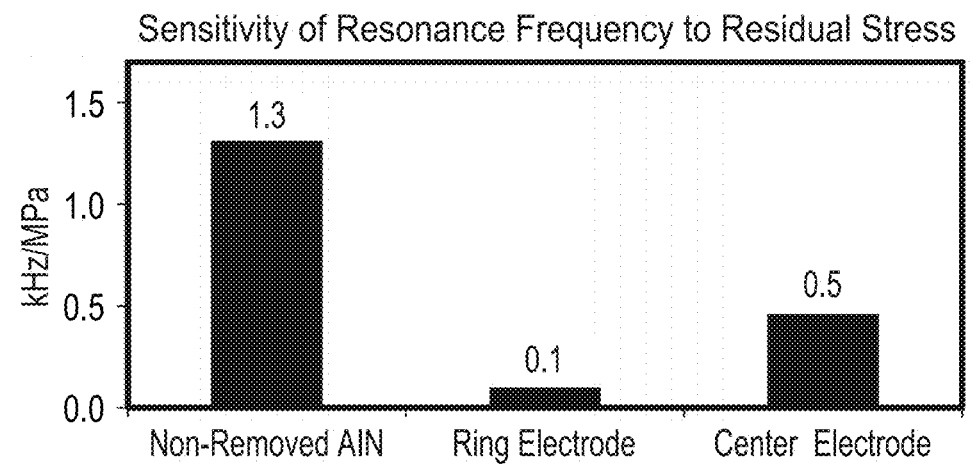
FIG. 11 is a bar plot of sensitivity of resonance frequency to residual stress for various configurations demonstrated according to an embodiment of the present disclosure.

FIG. 11 depicts a bar graph of sensitivity of resonance frequency to residual stress, shown for a non-removed piezo area PMUT (e.g., the prior art design shown in FIG. 1A and FIG. 1B), such as comprising aluminum nitride (AlN), having 1.3 kHz/MPa, compared with a ring electrode PMUT (having the piezo layer removed everywhere except beneath a ring electrode at the perimeter of the diaphragm) at 0.1 kHz/MPa, and a center electrode PMUT (having the piezo layer removed everywhere but beneath a circular center electrode) having a sensitivity of 0.5 kHz/MPa. It can be seen from the graph that using a patterned-diaphragm transducer where the piezoelectric layer is removed from the surface exhibits smaller frequency variation with residual stress than the flat-diaphragm design. This patterned-diaphragm transducer has the piezoelectric layer removed from the surface, except for either in the center of the diaphragm (referred to as a "Center Electrode" design) or in a ring surrounding the perimeter of the diaphragm (referred to as a "Ring Electrode" design).

Figure 12:
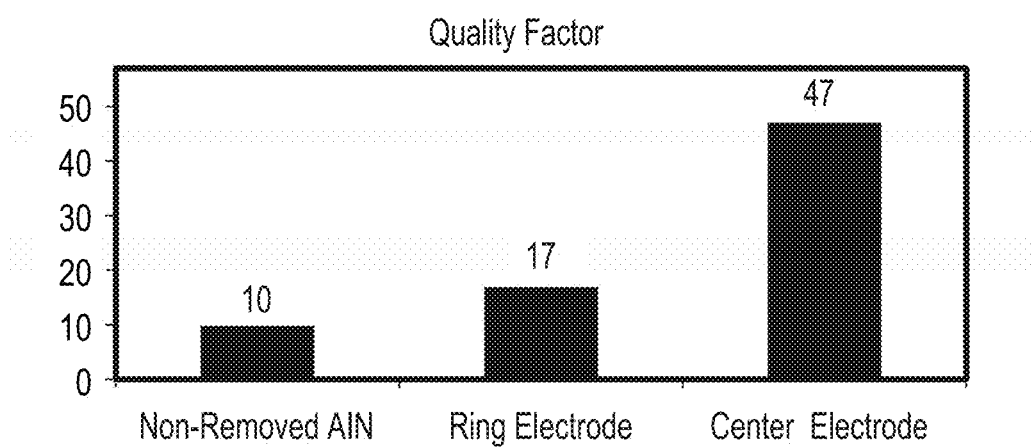
FIG. 12 is a bar plot of quality factor for various configurations demonstrated according to an embodiment of the present disclosure.

FIG. 12 depicts a bar graph of quality factor comparing different transducer types. Quality factor is seen for the non-removed AlN at 10, a ring electrode at 17, and a center electrode at a quality factor of 47. It is apparent that using a patterned-diaphragm transducer where the piezoelectric layer is removed from the surface provides a higher quality factor.

Figure 13:
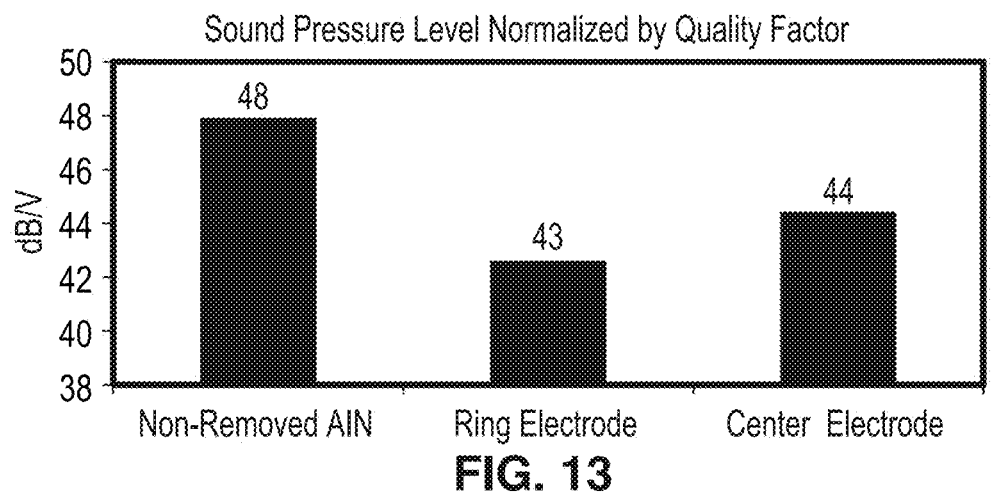
FIG. 13 is a bar plot of sound pressure level for various configurations demonstrated according to an embodiment of the present disclosure.

FIG. 13 depicts output sound pressure level (SPL) (at 5 cm distance), normalized by the quality factor, in comparing the above patterned-diaphragm transducers. Sound pressure is seen as 48 dB/V for the non-removed AlN, 43 dB/V for the ring electrode, and 44 dB/V for the center electrode. It is thus seen that the sound pressure is only slightly less for the ring electrode and center electrode types. The lower pressure is due to reduced coupling of the piezoelectric strain into membrane displacement. Therefore, these configurations trade-off stress robustness for reduced bandwidth, unlike the thick ribs pattern configurations.

Figure 14:
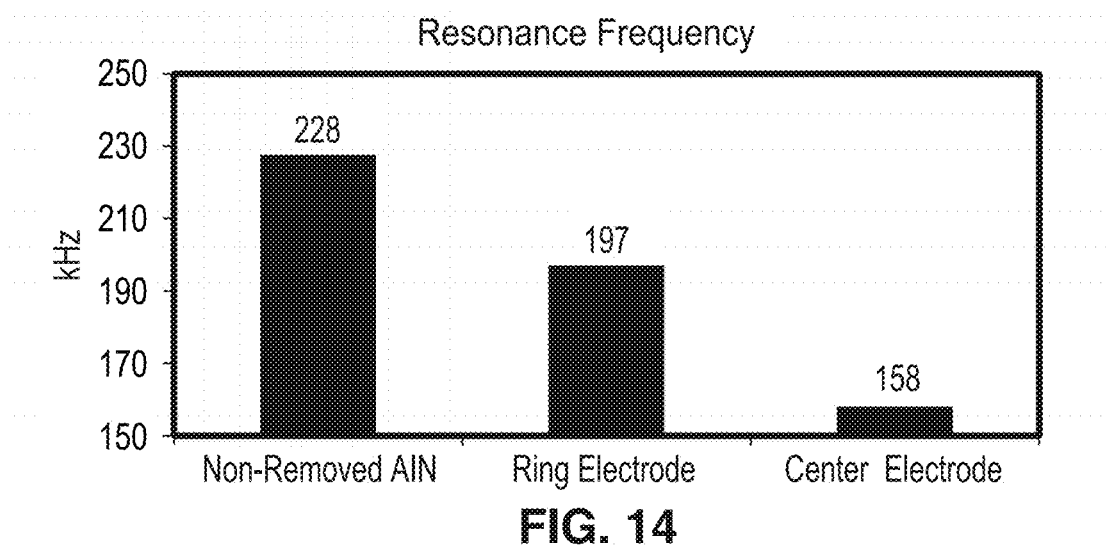
FIG. 14 is a bar plot of resonance frequency for various configurations demonstrated according to an embodiment of the present disclosure.

FIG. 14 depicts the resonance frequency of each of these described configurations, with resonance for the non-removed AlN at 228 kHz, the ring electrode at 197 kHz, and the center electrode at 158 kHz. So the fundamental frequencies are seen to vary for a given size in each of these geometries. It will be appreciated, of course, that the size and thickness of each design type can be modified to achieve a desired fundamental frequency.

Figure 15A:
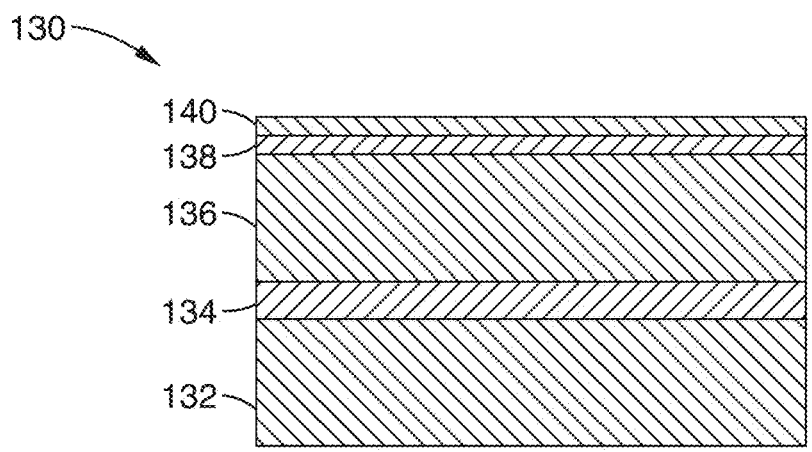
FIG. 15A through FIG. 15E are cross section views in steps for fabricating a patterned PMUT according to an embodiment of the present disclosure.

FIG. 15A through FIG. 15E illustrate an example fabrication sequence embodiment 130, in which fabrication is preferably performed utilizing standard micromachining techniques. By way of example and not limitation, one fabrication embodiment starts with a SOI (Silicon-On-Insulator) wafer having Si base layer 132 covered by a dielectric layer ($SiO_2$) 134 as seen in FIG. 15A. Over the dielectric layer 134 is a Si layer 136 that will serve as the elastic (passive) layer of the PMUT diaphragm. A bottom electrode layer (e.g., metal) is seen 138, over which is a piezo layer 140.

Figure 15B:
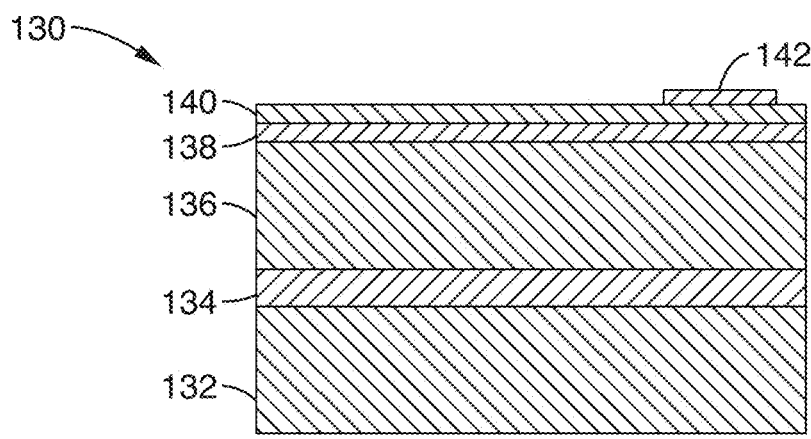
Figure 15C:
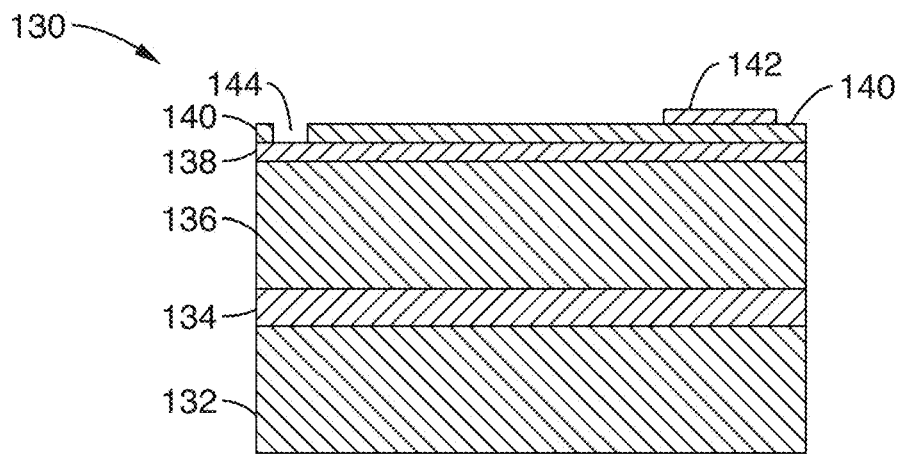
Figure 15D:
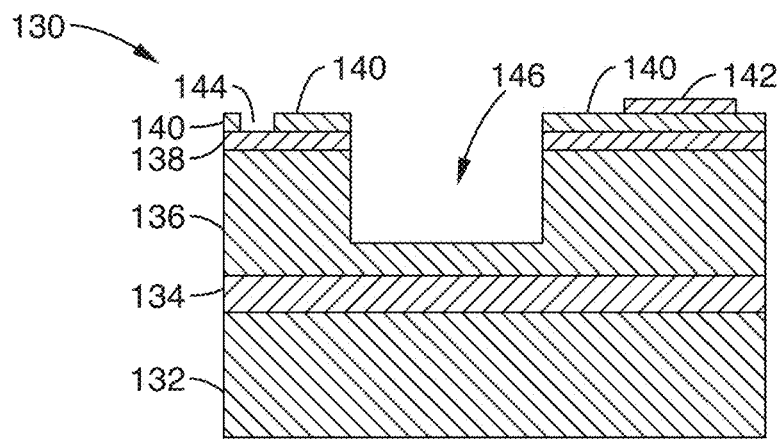
Figure 15E:
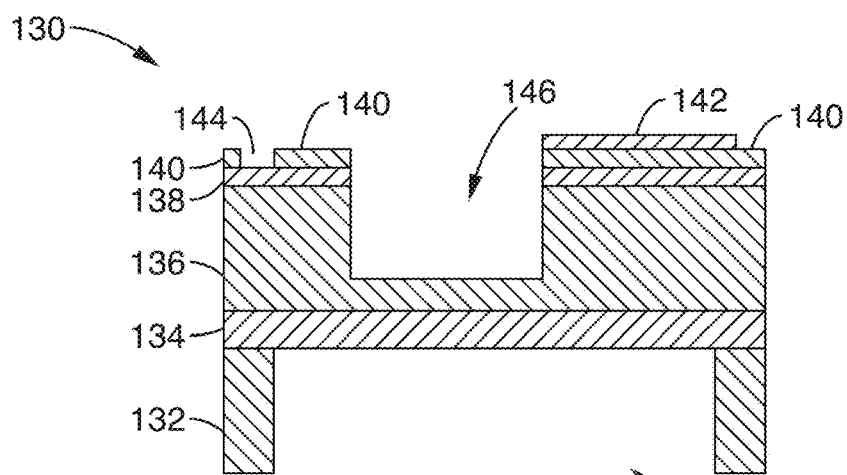

In the fabrication sequence a top electrode is deposited and patterned 142 shown in FIG. 15B, and one or more vias 144 created in FIG. 15C to the bottom electrode 138, such as by etching through the top piezo layer 140. Next, as seen in FIG. 15D, a portion of the piezo layer 140, the bottom electrode 138, and the passive layer 136 are patterned, such as by lithography and etching, removing mass from a central region 146 to form the ribbed structure of the PMUT. Finally, in FIG. 15E the PMUT diaphragm is released, such as by etching a center 148 in the backside handle using deep reactive-ion etching (DRIE). In FIG. 15E, the $SiO_2$ layer 134 remains on the back side of the PMUT diaphragm. In other embodiments, $SiO_2$ layer 134 may be removed.

Additional embodiments are described in this section for robust air-coupled piezoelectric micromachined ultrasonic transducers (PMUTs). The design achieves a ten fold (10×) reduction in the variation in fundamental frequency created by across-wafer residual stress gradients that are present in the piezoelectric AlN layer.

As discussed previously, FIG. 2A and FIG. 2B illustrated a patterned PMUT structure having reduced mass/enhanced stiffness. This design was implemented with an example created having a thick-layered PMUT diaphragm with an 8 μm thick passive layer and a 375 μm radius. Simultaneously, by patterning wedged shaped ribs the diaphragm mass was reduced while maintaining the enhanced stiffness of a thick-layered PMUT, with the wide bandwidth of the thin-layered PMUT maintained to achieve sufficient axial resolution in range measurement applications.

Figure 16:
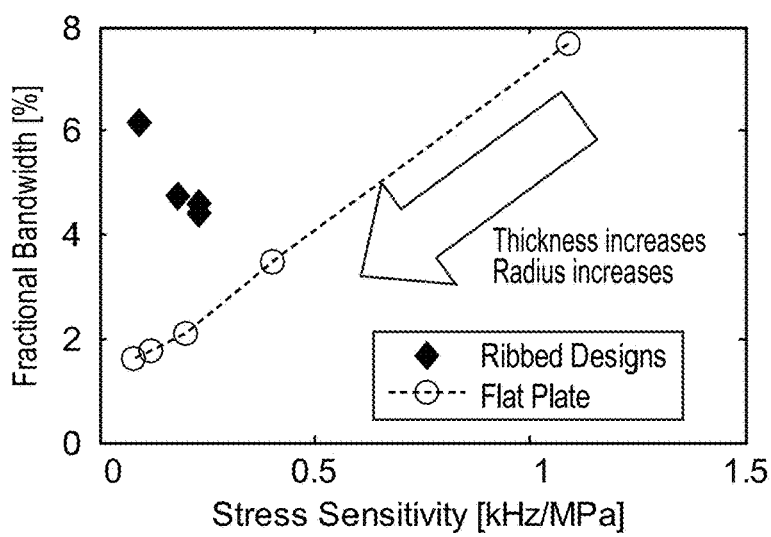
FIG. 16 is a plot of stress sensitivity with respect to fractional bandwidth, showing independence of stiffness and mass for patterned PMUTs according to embodiments of the present disclosure.

FIG. 16 depicts how the diaphragm mass and stiffness were independently modified from one another as a result of patterning the surface of the transducer. It can be seen in the figure that ribbed designs according to the present disclosure (seen as the diamond shape data points) do not follow that of flat plate designs (dashed lines through circular datum) in which mass and stiffness are dependent upon one another. Five ribbed designs were tested having rib widths varying from 5° to 45°.

In the present disclosure, the reduced-mass/enhanced-stiffness design improves the robustness of the transducer to residual stress, increases their output pressure and maintains a wide bandwidth.

To verify the approach, patterned aluminum nitride (AlN) PMUTs were fabricated. The example transducers have a 1 μm AlN active layer, 8 μm low-stress $SiO_2$ passive layer, and a 375 μm radius diaphragm. The fractional bandwidth of the transducer is inversely proportional to quality factor Q= $\sqrt{mk}/Z_0$, where m and k are the mass and stiffness of the diaphragm, with $Z_0$ representing acoustic impedance. The bandwidth is increased by removing mass from the center of the diaphragm. The velocity frequency response is measured using LDV (Laser Doppler Vibrometry), and is compared to the frequency response simulated by finite element method (FEM). The FEM solves a three dimensional axisymmetric piezo-acoustic model implemented in COMSOL.

Figure 17A:
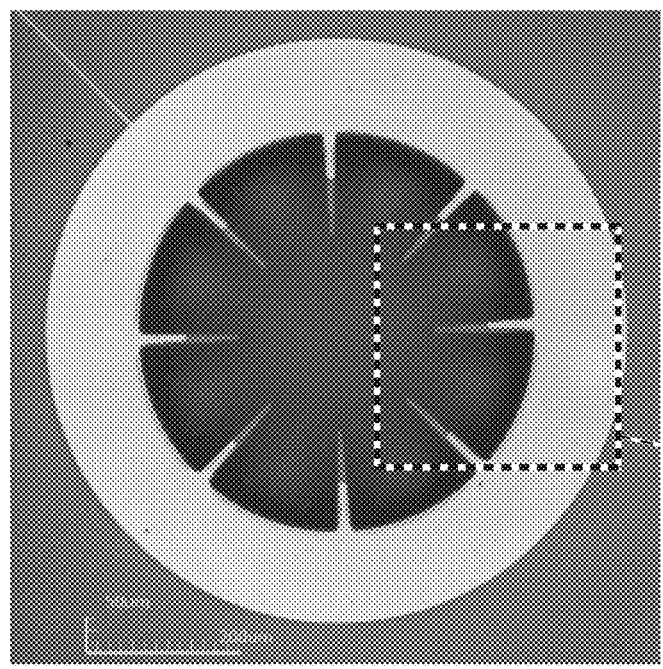
FIG. 17A and FIG. 17B are top and magnified image views of a thin-rib PMUT according to an embodiment of the present disclosure.
Figure 17B:
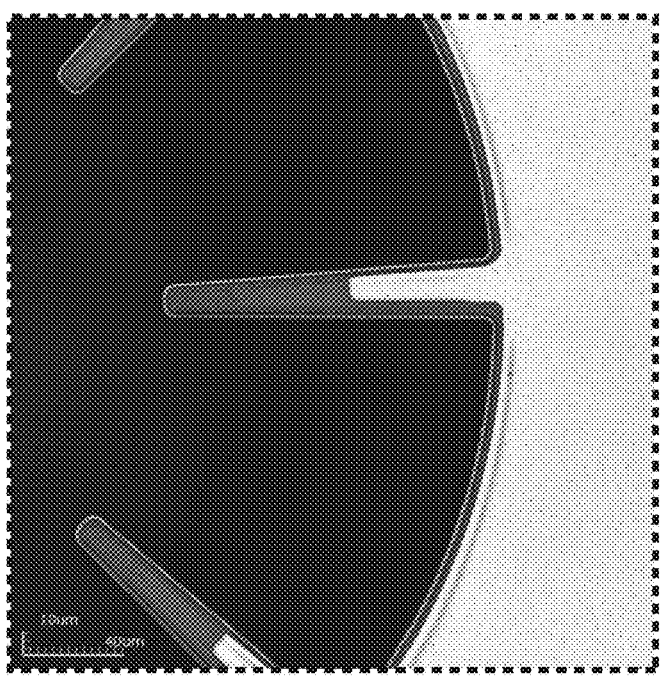

FIG. 17A and FIG. 17B illustrate an example embodiment of a new narrow rib design (e.g., 5° wide ribs) seen in FIG. 17A, with a magnified view seen in FIG. 17B. It should be noted that in this figure, the surface of each rib is partially covered by the aluminum top electrode metal, which appears light colored in the image, while the ends of the ribs are exposed aluminum nitride which appears darker. The black central region in the image is the exposed $SiO_2$ elastic layer in the center of the PMUT diaphragm.

Figure 18A:
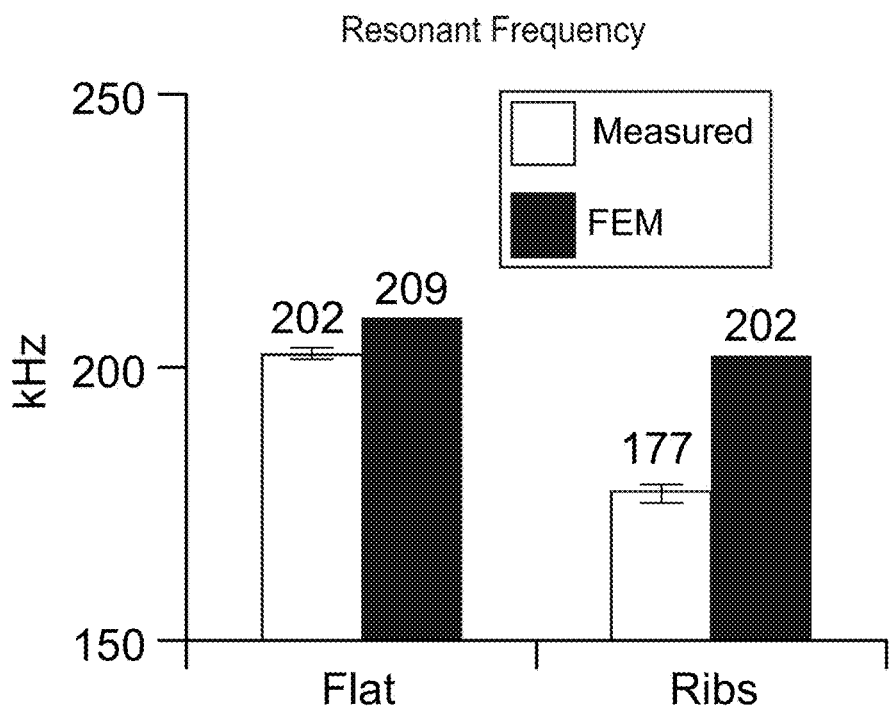
FIG. 18A and FIG. 18B are bar plots of resonant frequency and fractional bandwidth comparing flat PMUTs with ribbed PMUTs according to an embodiment of the present disclosure.

FIG. 18A compares simulated and measured frequency response between the original flat configuration and the 5° wide rib design. FEM analysis indicates 209 kHz for the flat design, and 202 kHz for the ribbed design, while the measured results came in with 202 kHz for the flat design and 177 kHz for the ribbed design, shown with error bars indicating maximum and minimum values for these measurements. The average measured center frequencies of the flat and ribbed configurations were found to be 202 kHz and 177 kHz, respectively.

Figure 18B:
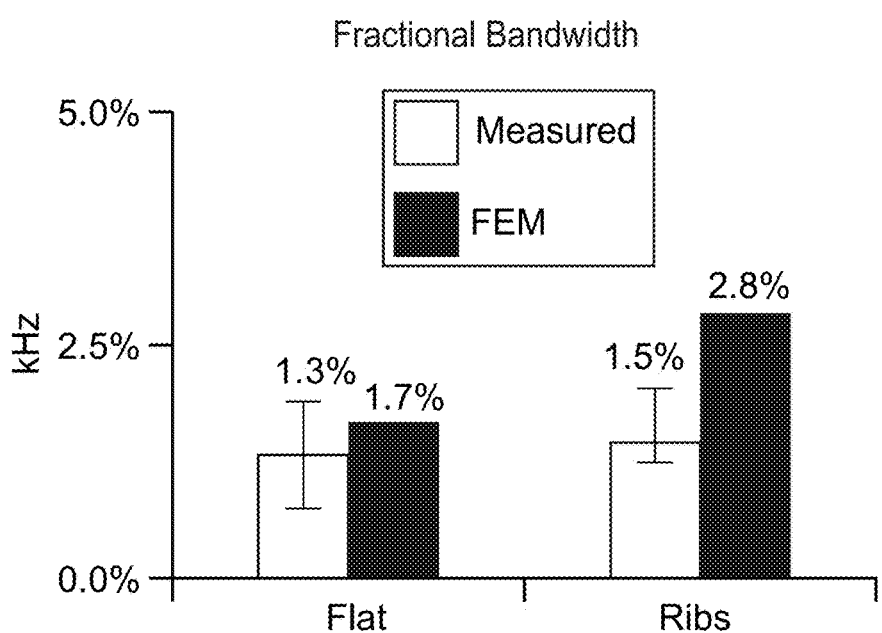

FIG. 18B compares simulated and measured fractional bandwidth between the original flat configuration and the 5° wide rib design. FEM analysis indicates fractional bandwidth of 1.7% for the flat design and 2.8% for the 5° wide rib design. The measured fractional bandwidths were found as 1.3% for the flat design and 1.5% for the 5° wide rib design, with error bars showing maximum and minimum values for these measurements.

In addition, the FEM analysis indicates that the thick design reduces the sensitivity of the resonance frequency to residual stress by a factor of 10 compared to thin diaphragms with the same fundamental frequency. The measured standard deviation of the resonance frequency across a 2.6 mm array is 0.3% and 0.6% for flat and ribbed configurations, respectively, while the across-wafer frequency variation was 15 kHz, both a factor of 10 lower than observed in thin-diaphragm devices fabricated on similar wafers (data not shown).

Figure 19:
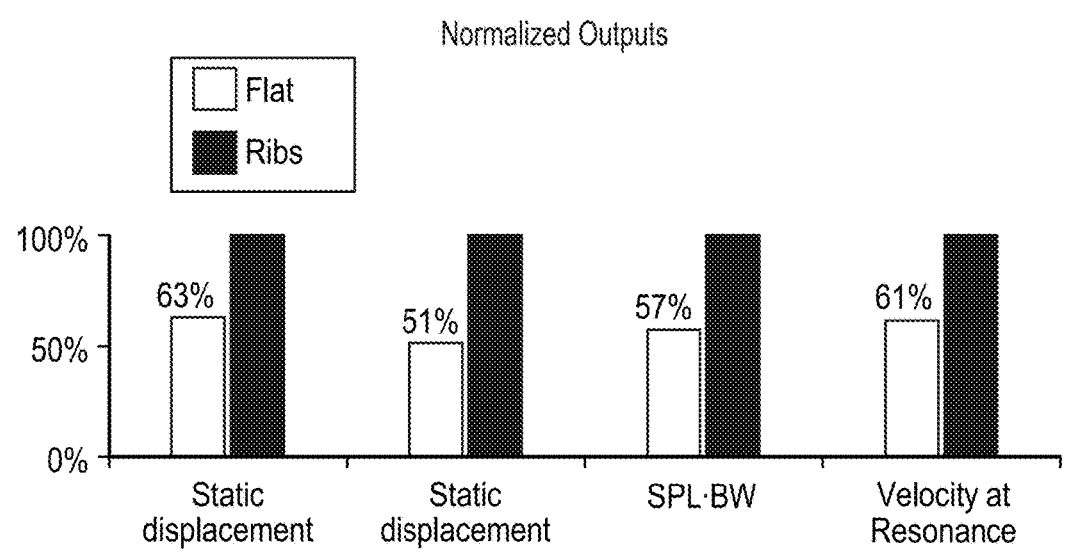
FIG. 19 is a bar plot of simulated and measured outputs comparing flat diaphragms and ribbed diaphragms configured according to an embodiment of the present disclosure.

FIG. 19 compares the characteristics of a flat design (shown as open bars) with those of a ribbed design (shown as filled bars). For each characteristic, the result for the ribbed design is taken as 100% and the result for the flat design is normalized to this value. In the left column of the figure, simulated static deflection (displacement) of the flat design is seen as 63% of the simulated value obtained for the rib design. In the next column, the measured static deflection (displacement) for the flat design is shown to be only 51% of the measured value obtained for the rib design. The simulated sound pressure level-bandwidth product (SPL.BW) for the flat design is seen as 57% of the simulated value for the ribbed design. The measured maximum velocity at resonance indicate that the flat design has 61% of the maximum velocity compared with that measured for the ribbed design. In view of all these tests, it is seen that the ribbed design has superior performance in comparison to the original flat plate design.

Thus, a variable thickness diaphragm is disclosed which simultaneously improves several performance metrics. Compared to the traditional flat plate design, the novel design is more robust to residual stress, has wider bandwidth, and is predicted to have higher output pressure. Therefore, this ribbed pattern design is more suitable than a flat plate for air-coupled range finding applications that require short time constant, high SPL output and good frequency matching of PMUTs within an array.

From the description herein, it will be appreciated that that the present disclosure encompasses multiple embodiments which include, but are not limited to, the following:

1. An apparatus for ultrasonic generation and sensing, comprising: (a) at least one elastic layer; (b) at least one piezoelectric material layer mechanically coupled to said elastic layer; (c) at least one electrode of electrically conductive material disposed in electrical contact with each side of said piezoelectric material providing electrodes for said piezoelectric material as a backside electrode and frontside electrode; (d) wherein a combination of said elastic layer, piezoelectric material layer, backside electrode, and frontside electrode form an ultrasonic diaphragm for generating ultrasonic signals in response to applying a selected transmission voltage waveform signal between said backside electrode and said frontside electrode, and/or for sensing ultrasonic signals in response to sensing a received voltage waveform signal between said backside electrode and said frontside electrode; and (e) wherein said diaphragm has a surface patterned with selective thinned areas through a combination of at least said piezoelectric material layer and said electrodes to vary the diaphragm thickness at specific locations to independently select mass and stiffness toward increasing bandwidth and reducing sensitivity to residual stress.

2. An apparatus for ultrasonic sound generation and sensing, comprising: (a) at least one elastic layer; (b) at least one piezoelectric material layer mechanically coupled to said elastic layer; (c) at least one electrode of electrically conductive material disposed in electrical contact with each side of said piezoelectric material providing electrodes for said piezoelectric material as a backside electrode and a frontside electrode; (d) wherein a combination of said elastic layer, piezoelectric material layer, backside electrode, and frontside electrode form a diaphragm; (e) wherein said diaphragm is configured for generating ultrasonic signals in response to applying a selected transmission voltage waveform signal between said backside electrode and said frontside electrode, and/or for sensing ultrasonic signals in response to sensing a received voltage waveform signal between said backside electrode and said frontside electrode; and (f) wherein said diaphragm is patterned on its surface leaving thinned areas passing through at least said piezoelectric layer and said backside electrode which configure said diaphragm with a selected mass and stiffness toward increasing bandwidth and reducing sensitivity to residual stress.

3. The apparatus as recited of any preceding embodiment, further comprising a base structure having a closed shape surrounding an opening over which said diaphragm is disposed.

4. The apparatus of any preceding embodiment, wherein said opening in said base structure forms a backside tube.

5. The apparatus of any preceding embodiment, wherein said frontside electrode comprises conductive material formed in a closed shape and surrounding an open area in which there is no conductive material.

6. The apparatus of any preceding embodiment, wherein said diaphragm is patterned underneath the layer of said frontside electrode in an area beneath said open area in said frontside electrode.

7. The apparatus of any preceding embodiment, wherein said diaphragm is patterned leaving thinned areas which pass through said piezoelectric layer and said backside electrode, as well as through a portion of said elastic layer reducing its thickness.

8. The apparatus of any preceding embodiment, wherein said diaphragm is patterned with multiple ribs of material from said piezoelectric layer and said backside electrode which extend in layers from beneath said frontside electrode into an area beneath the open region in said frontside electrode.

9. The apparatus of any preceding embodiment, wherein said ribs are distributed with equal spacing extending in layers from beneath said frontside electrode into area beneath the open region in said frontside electrode.

10. The apparatus of any preceding embodiment, wherein each of said ribs tapers along it length extending in the layers from beneath said frontside electrode into the area beneath the open region in said frontside electrode.

11. The apparatus of any preceding embodiment, wherein each of said ribs taper in an isosceles triangle shape or isosceles trapezoid shape.

12. The apparatus of any preceding embodiment, wherein said diaphragm is patterned on its surface beneath the open area of said closed shape in the frontside electrode, and also beneath a portion of said frontside electrode.

13. The apparatus of any preceding embodiment, wherein said patterning of said diaphragm comprises material layer remnants of said diaphragm after said open areas in said piezoelectric layer and said electrode backside electrode have been removed.

14. The apparatus of any preceding embodiment, wherein said diaphragm is patterned with material added in said piezoelectric layer and said backside electrode to surround said open areas in said diaphragm.

15. The apparatus of any preceding embodiment, wherein said diaphragm is patterned on its surface to decouple resonance frequency and bandwidth characteristics making them substantially independent variables.

16. The apparatus of any preceding embodiment, wherein said piezoelectric layer comprises a material selected from the group of piezoelectric materials consisting of Aluminum Nitride (AlN), Apatite, Barium Titanate (BaTiO$_3$), Berlinite (AlPO$_4$), various Ceramic materials, Allium Phosphate, Gallium Orthophosphate, Gallium Nitride (GaN), Lanthanum Gallium Silicate, Lead Scandium Tantalate, Lead Magnesium Niobate (PMN), Lead Zirconate Titanate (PZT), Lithium Tantalate, Polyvinylidene Fluoride (PVDF), Potassium Sodium Tartrate, Quartz (SiO$_2$), Zinc Oxide (ZnO), and combinations thereof.

17. The apparatus of any preceding embodiment, wherein said elastic layer comprises a passive material.

18. The apparatus of any preceding embodiment, wherein said passive material comprises Silicon (Si), Silicon Nitride (Si$_3$N$_4$), or an oxide of Silicon, including SiO$_2$.

19. The apparatus of any preceding embodiment, wherein said elastic layer comprises an active piezoelectric material.

20. The apparatus of any preceding embodiment, wherein said elastic layer comprises a material selected from a group of piezoelectric materials consisting of Aluminum Nitride (AlN), Apatite, Barium Titanate (BaTiO$_3$), Berlinite (AlPO$_4$), various Ceramic materials, Allium Phosphate, Gallium Orthophosphate, Gallium Nitride (GaN), Lanthanum Gallium Silicate, Lead Scandium Tantalate, Lead Magnesium Niobate (PMN), Lead Zirconate Titanate (PZT), Lithium Tantalate, Polyvinylidene Fluoride (PVDF), Potassium Sodium Tartrate, Quartz (SiO$_2$), Zinc Oxide (ZnO), and combinations thereof.

21. The apparatus of any preceding embodiment, wherein the apparatus comprises a piezoelectric micromachined ultrasonic transducer (PMUT).

22. The apparatus of any preceding embodiment, wherein said apparatus comprises a piezoelectric micromachined ultrasonic transducer (PMUT) utilized in an array of PMUTs.

23. The apparatus of any preceding embodiment, wherein a surface of said diaphragm is patterned by selectively etching said diaphragm to remove material from a center portion of said diaphragm.

24. The apparatus of any preceding embodiment, wherein the diaphragm surface is selectively etched to leave radial stiffening ribs at the perimeter of the diaphragm.

25. The apparatus of any preceding embodiment, wherein the diaphragm diameter is from approximately 100 microns to 2 millimeters and the maximum thickness of the diaphragm is from 1 micron to 40 microns.

26. The apparatus of any preceding embodiment, wherein the center frequency ranges from 40 kHz to 800 kHz.

27. The apparatus of any preceding embodiment, wherein an array of transducers all having an identical nominal center frequency are fabricated on a common substrate.

28. A method of fabricating a piezoelectric micromachined ultrasonic transducer (PMUT) configured for ultrasonic generation and/or sensing, comprising: (a) forming at least one planar elastic layer from passive material; (b) forming a backside electrode of conductive material over said planar elastic layer; (b) forming at least one piezoelectric material layer in having a first side in electrical content with said backside electrode; (c) forming a frontside electrode of conductive material in electrical contact with a second side of said piezoelectric material layer; (d) wherein the combination of said elastic layer, piezoelectric material layer, backside electrode, and frontside electrode form a diaphragm of a piezoelectric micromachined ultrasonic transducer (PMUT); (e) etching through at least said piezoelectric material layer and said backside electrode to form a pattern of ribs in said diaphragm around which at least said piezoelectric material and said backside electrode material have been removed; and (f) whereby said etching to form the pattern of ribs configures diaphragm mass and stiffness to increase bandwidth and reduce sensitivity to residual stress.

Although the description herein contains many details, these should not be construed as limiting the scope of the disclosure but as merely providing illustrations of some of the presently preferred embodiments. Therefore, it will be appreciated that the scope of the disclosure fully encompasses other embodiments which may become obvious to those skilled in the art.

In the claims, reference to an element in the singular is not intended to mean "one and only one" unless explicitly so stated, but rather "one or more." All structural, chemical, and functional equivalents to the elements of the disclosed embodiments that are known to those of ordinary skill in the art are expressly incorporated herein by reference and are intended to be encompassed by the present claims. Furthermore, no element, component, or method step in the present disclosure is intended to be dedicated to the public regardless of whether the element, component, or method step is explicitly recited in the claims. No claim element herein is to be construed as a "means plus function" element unless the element is expressly recited using the phrase "means for". No claim element herein is to be construed as a "step plus function" element unless the element is expressly recited using the phrase "step for".

What is claimed is:

1. An apparatus for ultrasonic generation and sensing, comprising:
    (a) at least one elastic layer;
    (b) at least one piezoelectric material layer mechanically coupled to said elastic layer; and
    (c) at least one electrode of electrically conductive material disposed in electrical contact with each side of said piezoelectric material providing electrodes for said piezoelectric material as a backside electrode and frontside electrode, wherein said frontside electrode comprises conductive material formed in a closed shape and surrounding an open area in which there is no conductive material;
    (d) wherein a combination of said elastic layer, piezoelectric material layer, backside electrode, and frontside electrode form an ultrasonic diaphragm configured for: (i) generating ultrasonic signals in response to applying a selected transmission voltage waveform signal between said backside electrode and said frontside electrode, or (ii) sensing ultrasonic signals in response to sensing a received voltage waveform signal between said backside electrode and said frontside electrode, or (iii) performing a combination of (d)(i) and (d)(ii); and (e) wherein said diaphragm has a surface patterned with selective thinned areas through a combination of at least said piezoelectric material layer and said electrodes to vary the diaphragm thickness at specific locations to independently select mass and stiffness toward increasing bandwidth and reducing sensitivity to residual stress, and wherein said diaphragm either (i) is patterned with multiple ribs of material from said piezoelectric layer and said backside electrode which extend in layers from beneath said frontside electrode into an area beneath the open region in said frontside electrode, or (ii) is patterned on its surface beneath the open area of said closed shape in the frontside electrode, and also beneath a portion of said frontside electrode.

2. An apparatus for ultrasonic sound generation and sensing, comprising:
(a) at least one elastic layer;
(b) at least one piezoelectric material layer mechanically coupled to said elastic layer;
(c) at least one electrode of electrically conductive material disposed in electrical contact with each side of said piezoelectric material providing electrodes for said piezoelectric material as a backside electrode and a frontside electrode, wherein said frontside electrode comprises conductive material formed in a closed shape and surrounding an open area in which there is no conductive material;
(d) wherein a combination of said elastic layer, piezoelectric material layer, backside electrode, and frontside electrode form a diaphragm;
(e) wherein said diaphragm is configured for: (i) generating ultrasonic signals in response to applying a selected transmission voltage waveform signal between said backside electrode and said frontside electrode, or (ii) sensing ultrasonic signals in response to sensing a received voltage waveform signal between said backside electrode and said frontside electrode, or (iii) performing a combination of (e)(i) and (e)(ii); and
(f) wherein said diaphragm is patterned on its surface leaving thinned areas passing through at least said piezoelectric layer and said backside electrode which configure said diaphragm with a selected mass and stiffness toward increasing bandwidth and reducing sensitivity to residual stress, and wherein said diaphragm either (i) is patterned with multiple ribs of material from said piezoelectric layer and said backside electrode which extend in layers from beneath said frontside electrode into an area beneath the open region in said frontside electrode, or (ii) patterned on its surface beneath the open area of said closed shape in the frontside electrode, and also beneath a portion of said frontside electrode.

3. The apparatus as recited in claim 1 or claim 2, further comprising a base structure having a closed shape surrounding an opening over which said diaphragm is disposed.

4. The apparatus as recited in claim 3, wherein said opening in said base structure forms a backside tube.

5. The apparatus as recited in claim 1 or claim 2, wherein said diaphragm is patterned underneath the layer of said frontside electrode in an area beneath said open area in said frontside electrode.

6. The apparatus as recited in claim 1 or claim 2, wherein said diaphragm is patterned leaving thinned areas which pass through said piezoelectric layer and said backside electrode, as well as through a portion of said elastic layer reducing its thickness.

7. The apparatus as recited in claim 1 or claim 2, wherein for the diaphragm patterned with multiple ribs, said ribs are distributed with equal spacing extending in layers from beneath said frontside electrode into area beneath the open region in said frontside electrode.

8. The apparatus as recited in claim 1 or claim 2, wherein for the diaphragm patterned with multiple ribs, each of said ribs tapers along its length extending in the layers from beneath said frontside electrode into the area beneath the open region in said frontside electrode.

9. The apparatus as recited in claim 1 or claim 2, wherein for the diaphragm patterned with multiple ribs, each of said ribs taper in an isosceles triangle shape or isosceles trapezoid shape.

10. The apparatus as recited in claim 1 or claim 2, wherein said patterning of said diaphragm comprises material layer remnants of said diaphragm after said open areas in said piezoelectric layer and said electrode backside electrode have been removed.

11. The apparatus as recited in claim 1 or claim 2, wherein said diaphragm is patterned with material added in said piezoelectric layer and said backside electrode to surround said open areas in said diaphragm.

12. The apparatus as recited in claim 1 or claim 2, wherein said diaphragm is patterned on its surface to decouple resonance frequency and bandwidth characteristics making them substantially independent variables.

13. The apparatus as recited in claim 1 or claim 2, wherein said piezoelectric layer comprises a material selected from the group of piezoelectric materials consisting of Aluminum Nitride (AlN), Apatite, Barium Titanate ($BaTiO_3$), Berlinite ($AlPO_4$), various Ceramic materials, Allium Phosphate, Gallium Orthophosphate, Gallium Nitride (GaN), Lanthanum Gallium Silicate, Lead Scandium Tantalate, Lead Magnesium Niobate (PMN), Lead Zirconate Titanate (PZT), Lithium Tantalate, Polyvinylidene Fluoride (PVDF), Potassium Sodium Tartrate, Quartz ($SiO_2$), Zinc Oxide (ZnO), and combinations thereof.

14. The apparatus as recited in claim 1 or claim 2, wherein said elastic layer comprises a passive material.

15. The apparatus as recited in claim 14, wherein said passive material comprises Silicon (Si), Silicon Nitride ($Si_3N_4$), or an oxide of Silicon, including $SiO_2$.

16. The apparatus as recited in claim 1 or claim 2, wherein said elastic layer comprises an active piezoelectric material.

17. The apparatus as recited in claim 16, wherein said elastic layer comprises a material selected from a group of piezoelectric materials consisting of Aluminum Nitride (AlN), Apatite, Barium Titanate ($BaTiO_3$), Berlinite ($AlPO_4$), various Ceramic materials, Allium Phosphate, Gallium Orthophosphate, Gallium Nitride (GaN), Lanthanum Gallium Silicate, Lead Scandium Tantalate, Lead Magnesium Niobate (PMN), Lead Zirconate Titanate (PZT), Lithium Tantalate, Polyvinylidene Fluoride (PVDF), Potassium Sodium Tartrate, Quartz ($SiO_2$), Zinc Oxide (ZnO), and combinations thereof.

18. The apparatus as recited in claim 1 or claim 2, wherein the apparatus comprises a piezoelectric micromachined ultrasonic transducer (PMUT).

19. The apparatus as recited in claim 1 or claim 2, wherein said apparatus comprises a piezoelectric micromachined ultrasonic transducer (PMUT) utilized in an array of PMUTs.

20. The apparatus as recited in claim 1 or claim 2, wherein a surface of said diaphragm is patterned by selectively etching said diaphragm to remove material from a center portion of said diaphragm.

21. The apparatus as recited in claim 1 or claim 2, wherein the diaphragm surface is selectively etched to leave radial stiffening ribs at the perimeter of the diaphragm.

22. The apparatus as recited in claim 1 or claim 2, wherein the diaphragm diameter is from approximately 100 microns to 2 millimeters and the maximum thickness of the diaphragm is from 1 micron to 40 microns.

23. The apparatus as recited in claim 1 or claim 2, wherein the center frequency ranges from 40 kHz to 800 kHz.

24. The apparatus as recited in claim 1 or claim 2, wherein an array of transducers all having an identical nominal center frequency are fabricated on a common substrate.

* * * * *